(12) United States Patent
Shim

(10) Patent No.: US 10,971,071 B2
(45) Date of Patent: *Apr. 6, 2021

(54) ORGANIC LIGHT EMITTING DISPLAY PANEL HAVING SUB-PIXELS WITH DIFFERENT COUPLING CAPACITORS

(71) Applicant: SAMSUNG DISPLAY CO., LTD., Yongin-si (KR)

(72) Inventor: Jung-Hoon Shim, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 16/709,783

(22) Filed: Dec. 10, 2019

(65) Prior Publication Data

US 2020/0111419 A1 Apr. 9, 2020

Related U.S. Application Data

(63) Continuation of application No. 16/056,453, filed on Aug. 6, 2018, now Pat. No. 10,504,445, which is a
(Continued)

(30) Foreign Application Priority Data

Nov. 4, 2015 (KR) .................. 10-2015-0154214

(51) Int. Cl.
*G09G 5/10* (2006.01)
*G09G 3/3258* (2016.01)
(Continued)

(52) U.S. Cl.
CPC ......... *G09G 3/3258* (2013.01); *G09G 3/2003* (2013.01); *G09G 3/2018* (2013.01);
(Continued)

(58) Field of Classification Search
CPC .. G09G 3/3258; G09G 3/2018; G09G 3/3233; G09G 3/2003; G09G 3/3225;
(Continued)

(56) References Cited

U.S. PATENT DOCUMENTS

2006/0220580 A1 10/2006 Omata et al.
2007/0152920 A1 7/2007 Yamashita et al.
(Continued)

FOREIGN PATENT DOCUMENTS

KR 10-2012-0080008 A 7/2012

*Primary Examiner* — Adam J Snyder
(74) *Attorney, Agent, or Firm* — Lewis Roca Rothgerber Christie LLP

(57) ABSTRACT

An organic light emitting display panel includes a first sub-pixel, a second sub-pixel, and a third sub-pixel for respectively emitting differently colored lights, each of the sub-pixels including a switching transistor connected to a data line, and having a gate electrode configured to receive a scan signal, a driving transistor connected to the switching transistor, an emission control transistor connected to the driving transistor, and having a gate electrode configured to receive an emission control signal, an emission control line connected to the gate electrode of the emission control transistor, an organic light emitting diode connected the emission control transistor, and coupling capacitor including a first electrode including a portion of the emission control line, and a second electrode including an anode of the organic light emitting diode overlapping the portion of the emission control line, wherein capacitances of a first capacitor including the coupling capacitor of the first sub-pixel and a second capacitor including the coupling capacitor of the second sub-pixel are greater than a capacitance of a third capacitor including the coupling capacitor of the third sub-pixel.

11 Claims, 7 Drawing Sheets

Related U.S. Application Data continuation of application No. 15/134,171, filed on Apr. 20, 2016, now Pat. No. 10,043,450.

(51) Int. Cl.
*H01L 27/32* (2006.01)
*G09G 3/20* (2006.01)
*G09G 3/3233* (2016.01)
*G09G 3/3225* (2016.01)

(52) U.S. Cl.
CPC ....... *G09G 3/3233* (2013.01); *H01L 27/3216* (2013.01); *H01L 27/3218* (2013.01); *H01L 27/3248* (2013.01); *H01L 27/3262* (2013.01); *H01L 27/3265* (2013.01); *H01L 27/3276* (2013.01); *G09G 3/3225* (2013.01); *G09G 2300/0426* (2013.01); *G09G 2300/0452* (2013.01); *G09G 2300/0809* (2013.01); *G09G 2300/0819* (2013.01); *G09G 2300/0852* (2013.01); *G09G 2300/0861* (2013.01); *G09G 2300/0876* (2013.01); *G09G 2320/0233* (2013.01); *G09G 2320/0242* (2013.01); *G09G 2320/045* (2013.01); *G09G 2320/0653* (2013.01)

(58) Field of Classification Search
CPC .............. H01L 27/3218; H01L 27/3216; H01L 27/3248; H01L 27/3262; H01L 27/3265; H01L 27/3276
See application file for complete search history.

(56) References Cited

U.S. PATENT DOCUMENTS

| | | |
|---|---|---|
| 2011/0157250 A1* | 6/2011 | Hasegawa ............ G09G 3/3283 345/690 |
| 2014/0034923 A1 | 2/2014 | Kim et al. |
| 2014/0070184 A1 | 3/2014 | Shin |
| 2014/0071175 A1 | 3/2014 | Yang et al. |
| 2014/0117340 A1 | 5/2014 | Kim |
| 2014/0292622 A1 | 10/2014 | Lee |

* cited by examiner

ORGANIC LIGHT EMITTING DISPLAY PANEL HAVING SUB-PIXELS WITH DIFFERENT COUPLING CAPACITORS

CROSS-REFERENCE TO RELATED APPLICATION

This application is a continuation of U.S. patent application Ser. No. 16/056,453, filed Aug. 6, 2018, which is a continuation of U.S. patent application Ser. No. 15/134,171, filed Apr. 20, 2016, now U.S. Pat. No. 10,043,450, which claims priority to and the benefit of Korean Patent Application No. 10-2015-0154214, filed Nov. 4, 2015, the entire content of all of which is incorporated herein by reference.

BACKGROUND

1. Field

Example embodiments of the inventive concept relate to display devices, and to organic light emitting display panels having a plurality of pixels.

2. Description of the Related Art

An organic light emitting display device is able to display an image using sub-pixels, for example, a red sub-pixel, a blue sub-pixel, and a green sub-pixel. The organic light emitting display device may use an AMOLED Impulsive Driving (AID) dimming method, which adjusts on/off duties of an emission control signal when the organic light emitting display device displays a low-luminance/low-grayscale image that is less than or equal to about 100 nit to improve luminance uniformity and color balance.

However, organic light emitting diodes in the sub-pixels, which respectively output different colors of light, have different emission efficiencies caused by a difference of the characteristics of materials, such that a color difference or luminance difference may be shown at an image of low luminance (or low grayscale), which requires low power. For example, when the AID dimming method is performed to display the low luminance (or low grayscale) image, the luminance of the green sub-pixel increases, while the luminance of the red and blue sub-pixels decreases, due to a difference of offset direction, so that a screen or the image has a defect of a greenish hue.

SUMMARY

Example embodiments provide an organic light emitting display panel including sub-pixels, each of which having different capacitance formed in an organic light emitting diode and an emission control line.

According to example embodiments, an organic light emitting display panel includes a first sub-pixel, a second sub-pixel, and a third sub-pixel for respectively emitting differently colored lights, each of the sub-pixels including a switching transistor connected to a data line, and having a gate electrode configured to receive a scan signal, a driving transistor connected to the switching transistor, an emission control transistor connected to the driving transistor, and having a gate electrode configured to receive an emission control signal, an emission control line connected to the gate electrode of the emission control transistor, an organic light emitting diode connected the emission control transistor, and coupling capacitor including a first electrode including a portion of the emission control line, and a second electrode including an anode of the organic light emitting diode overlapping the portion of the emission control line, wherein capacitances of a first capacitor including the coupling capacitor of the first sub-pixel and a second capacitor including the coupling capacitor of the second sub-pixel are greater than a capacitance of a third capacitor including the coupling capacitor of the third sub-pixel.

Areas of the first and second electrodes of the first capacitor, and areas of the first and second electrodes of the second capacitor, may be respectively greater than areas of the first and second electrodes of the third capacitor.

An area of the anode of the first sub-pixel, and an area of the anode of the second sub-pixel, may be respectively greater than an area of the third sub-pixel.

The first electrode may further include at least a portion of the gate electrode of the emission control transistor.

The first sub-pixel may be configured to emit red color light, the second sub-pixel may be configured to emit blue color light, the third sub-pixel may be configured to emit green color light, and an emission efficiency of the third sub-pixel may be higher than an emission efficiency of each of the first and second sub-pixels.

The emission control transistor may be configured to receive the emission control signal that swings between an inactive level and an active level during an emission period within a frame period, the emission period including a period in which the organic light emitting diode is configured to emit light.

Each of the capacitors may be configured to raise a voltage of the corresponding anode by coupling based on the emission control signal swing.

Each of the sub-pixels may further include a storage capacitor, the storage capacitor including a first electrode including a gate electrode of the driving transistor, and a second electrode including a conductive pattern overlapping the first electrode of the storage capacitor.

Each of the sub-pixels may further include a compensation transistor connected to the driving transistor for compensating a threshold voltage of the driving transistor, and including a gate electrode configured to receive the scan signal.

Each of the sub-pixels may further include an initialization transistor connected to the gate electrode of the driving transistor, and including a gate electrode configured to receive an initialization signal to transmit an initialization voltage to the gate electrode of the driving transistor, and a bypass transistor connected to the anode, and including a gate electrode configured to receive a bypass control signal to transmit the initialization voltage to the anode.

The sub-pixels may be arranged in a pentile structure.

Areas of the second electrode of the first capacitor and the second electrode of the second capacitor may be respectively greater than an area of the second electrode of the third capacitor.

The sub-pixels may be arranged in a stripe structure.

Areas of the second electrode of the first capacitor and the second electrode of the second capacitor may be respectively greater than an area of the second electrode of the third capacitor.

According to example embodiments, an organic light emitting display panel includes a first sub-pixel, a second sub-pixel, and a third sub-pixel for respectively outputting differently colored lights, each of the sub-pixels including a driving transistor, a switching transistor, an emission control transistor connected to the driving transistor, and including a gate electrode configured to receive an emission control signal, an emission control line connected to the gate electrode of the emission control transistor, and an organic light emitting diode connected to the emission control transistor, and including an anode overlapping a portion of the emission control line.

Each of the first and second sub-pixels may further include a coupling capacitor including a first electrode including the gate electrode of the emission control transistor, and a portion of the emission control line, and a second electrode including a portion of the anode of the organic light emitting diode overlapping the gate electrode of the emission control transistor and the emission control line.

The gate electrode of the emission control transistor of the third sub-pixel and the emission control line might not overlap the anode of the organic light emitting diode of the third sub-pixel.

The first sub-pixel may be configured to emit red color light, the second sub-pixel may be configured to emit blue color light, the third sub-pixel may be configured to emit green color light, and an emission efficiency of the third sub-pixel may be higher than the emission efficiency of the first and second sub-pixels.

The gate electrode of the emission control transistor of the third sub-pixel and the emission control line of the third sub-pixel may overlap the anode of the organic light emitting diode of the third sub-pixel.

The third sub-pixel may further include a coupling capacitor including a first electrode including the gate electrode of the emission control transistor and a portion of the emission control line, and a second electrode including a portion of the anode of the organic light emitting diode overlapping with the gate electrode of the emission control transistor and the emission control line, and areas of the first and second electrodes of the coupling capacitor of the first sub-pixel, and areas of the first and second electrodes of the coupling capacitor of the second sub-pixel, may be respectively greater than areas of the first and second electrodes of the coupling capacitor of the third sub-pixel.

Therefore, the organic light emitting display panel according to example embodiments may include the first through third sub-pixels having coupling capacitors that have different capacitances based on the emission efficiency. Each of the coupling capacitors may be formed in a corresponding overlapped area where the emission control line and the anode of each sub-pixel are overlapped. Accordingly, the luminance of the sub-pixels having relatively low emission efficiency may be increased by the operation of the coupling capacitors when the AID dimming is performed. Thus, the color difference of the sub-pixels in the low-luminance (the low-grayscale) image may be prevented or reduced. In addition, the greenish defect in the low-luminance/low-grayscale image may be prevented or reduced.

BRIEF DESCRIPTION OF THE DRAWINGS

Example embodiments can be understood in more detail from the following description taken in conjunction with the accompanying drawings, in which.

DETAILED DESCRIPTION

Figure 1:
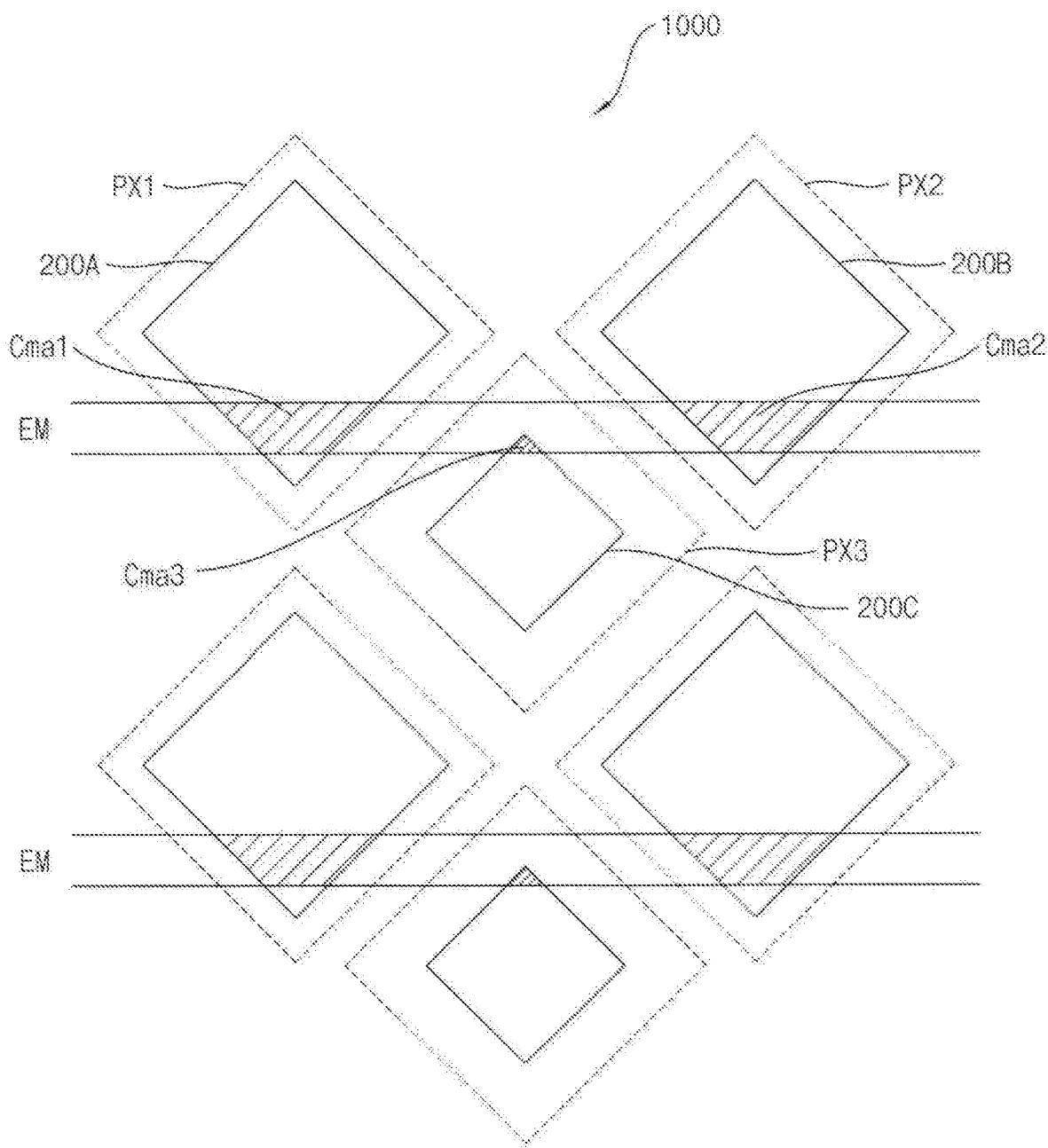
FIG. 1 is a diagram of a portion of an organic light emitting display panel according to example embodiments.

Features of the inventive concept and methods of accomplishing the same may be understood more readily by reference to the following detailed description of embodiments and the accompanying drawings. Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element, layer, region, or component is referred to as being "on," "connected to," or "coupled to" another element, layer, region, or component, it can be directly on, connected to, or coupled to the other element, layer, region, or component, or one or more intervening elements, layers, regions, or components may be present. In addition, it will also be understood that when an element or layer is referred to as being "between" two elements or layers, it can be the only element or layer between the two elements or layers, or one or more intervening elements or layers may also be present.

In the following examples, the x-axis, the y-axis and the z-axis are not limited to three axes of a rectangular coordinate system, and may be interpreted in a broader sense. For example, the x-axis, the y-axis, and the z-axis may be perpendicular to one another, or may represent different directions that are not perpendicular to one another.

The terminology used herein is for the purpose of describing particular embodiments only and is not intended to be limiting of the present invention. As used herein, the singular forms "a," "an," and "the" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

When a certain embodiment may be implemented differently, a specific process order may be performed differently from the described order. For example, two consecutively described processes may be performed substantially at the same time or performed in an order opposite to the described order.

The electronic or electric devices and/or any other relevant devices or components according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or formed on one substrate. Further, the various components of these devices may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the exemplary embodiments of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a diagram of a portion of an organic light emitting display panel according to example embodiments.

Referring to FIG. 1, the organic light emitting display panel 1000 may include a plurality of pixels. Each of the pixels may include a first sub-pixel PX1, a second sub-pixel PX2, and a third sub-pixel PX3 for respectively outputting different colors of light.

FIG. 1 shows an arrangement of emission control line EM with respect to the first through third sub-pixels PX1, PX2, and PX3.

Each of the first through third sub-pixels PX1, PX2, and PX3 may include a plurality of transistors including a driving transistor, an emission control transistor, etc., and may also include a storage capacitor, a coupling capacitor/coupling capacitance Cma1, Cma2, and Cma3, and an organic light emitting diode. Here, each of the coupling capacitors Cma1, Cma2, and Cma3 may include a first electrode (e.g., a first capacitor plate), which includes a portion of the emission control line EM, and a second electrode (e.g., a second capacitor plate), which includes a respective anode 200A, 200B, and 200C of the organic light emitting diode that overlaps with the first electrode. The first electrode of each of the coupling capacitors Cma1, Cma2, and Cma3 may further include at least a portion of a gate electrode of the corresponding emission control transistor.

The anodes 200A, 200B, and 200C of the organic light emitting diodes may respectively correspond to light emitting regions of the first through third sub-pixels PX1, PX2, and PX3. For example, as illustrated in FIG. 1, the light emitting regions of the first and second sub-pixels PX1 and PX2 may be greater than the light emitting region of the third sub-pixel PX3 (e.g., the size of the light emitting regions corresponding to an aperture ratio). In one embodiment, an area of the anode 200A of the first sub-pixel PX1 and an area of the anode 200B of the second sub-pixel PX2 may each be greater than an area of the anode 200C of the third sub-pixel PX3. Accordingly, sizes of the coupling capacitors between the anodes 200A, 200B, and 200C of the organic light emitting diodes and the emission control line EM may be designed differently. Thus, when an AMOLED impulsive driving (AID) dimming method is performed in a low-luminance area, coupling voltages (or increased voltages) by the coupling capacitors Cma1, Cma2, and Cma3 according to the sub-pixels PX1, PX2, and PX3 may be different. Here, the AID dimming method adjusts/controls on/off duties of an emission control signal to adjust the luminance. The AID dimming method is performed in the low-luminance area producing luminance that is below about 110 nit (cd/m²).

Each of the coupling capacitors Cma1, Cma2, and Cma3 may extract partial voltage of the emission control signal to the anodes 200A, 200B, and 200C of the organic light emitting diodes based on a fluctuation of the emission control signal. Thus, voltages of the anodes 200A, 200B, and 200C of the organic light emitting diodes may be changed, or may fluctuate, by the coupling of the coupling capacitors Cma1, Cma2, and Cma3, respectively (e.g., by extracting the partial voltage of the emission control signal).

Hereinafter, the first capacitor Cma1 is the coupling capacitor of the first sub-pixel PX1, the second capacitor Cma2 is the coupling capacitor of the second sub-pixel PX2, and the third capacitor Cma3 is the coupling capacitor of the third sub-pixel PX3. Capacitances of the first and second capacitors Cma1 and Cma2 may be greater than a capacitance of the third capacitor Cma3. Here, the capacitances of the first and second capacitors Cma1 and Cma2 may be substantially the same, or may be different. In addition, the capacitances of the first through third capacitors Cm1, Cma2, and Cma3 may have values determined based on the respective emission efficiencies of the organic light emitting diodes. In one embodiment, the areas of the first and second electrodes of the first capacitor Cma1, and areas of the first and second electrodes of the second capacitor Cma2, may be greater than areas of the first and second electrodes of the third capacitor Cma3. Accordingly, as illustrated in FIG. 1, the overlapped portions between the emission control line EM and the anodes 200A, 200B, and 200C of the organic light emitting diodes may be the first through third capacitors Cm1, Cma2, and Cma3, respectively. Also, each of the first through third sub-pixels PX1, PX2, and PX3 may include two emission control transistors. Gate electrodes of the emission control transistors may be connected to the emission line EM. Thus, the gate electrodes of the emission control transistors may be considered to be part of the emission control line EM.

In one embodiment, the first sub-pixel PX1 may emit red color light, the second sub-pixel PX2 may emit blue color light, and the third sub-pixel PX3 may emit green color light. Here, the emission efficiency of the third sub-pixel PX3 may be relatively higher than the emission efficiencies of the first and second sub-pixels PX1 and PX2. However, this is only an example, and the colors of light emitted from the sub-pixels PX1, PX2, and PX3 are not limited thereto. For example, colors of light may be determined by the emission efficiencies of the sub-pixels PX1, PX2, and PX3.

When the AID dimming method is performed, the voltages of the anodes 200A and 200B of the first and second sub-pixels PX1 and PX2 may be raised by the coupling of the first and second capacitors Cma1 and Cma2, respectively. Thus, the luminance of the first and second sub-pixels PX1 and PX2 may be increased. Also, the color difference, or the luminance difference, between the third sub-pixel PX3 and the first and second sub-pixels PX1 and PX2, which is due to differences of the emission efficiency, may be reduced. Therefore, a greenish hue in a displayed image when the organic light emitting display panel 1000 displays the low-luminance/low-grayscale image may be prevented or reduced.

Figure 2:
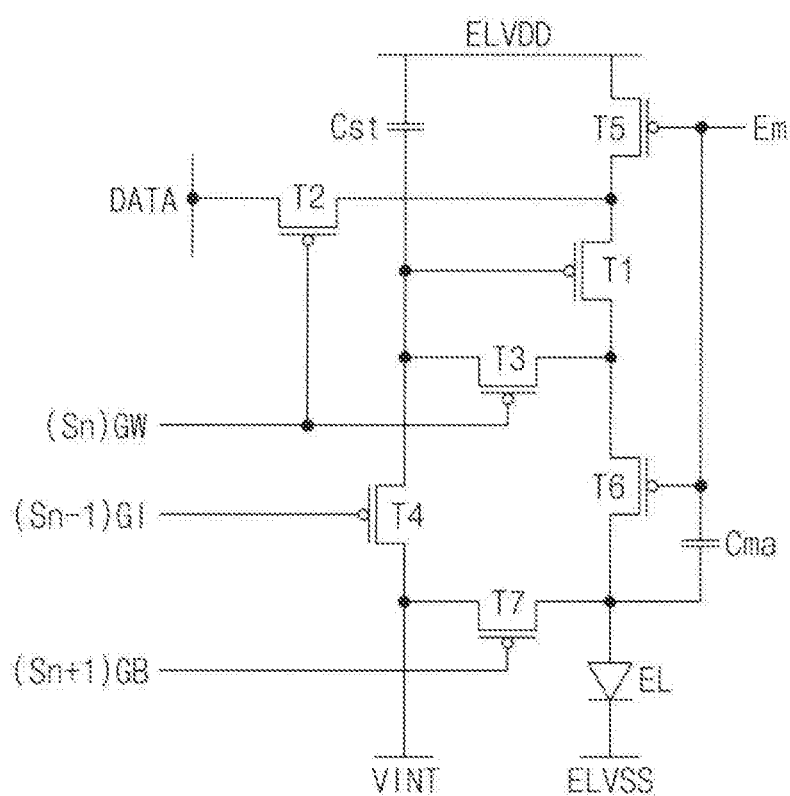
FIG. 2 is a circuit diagram illustrating an example of a sub-pixel included in the organic light emitting display panel of FIG. 1.
Figure 3:
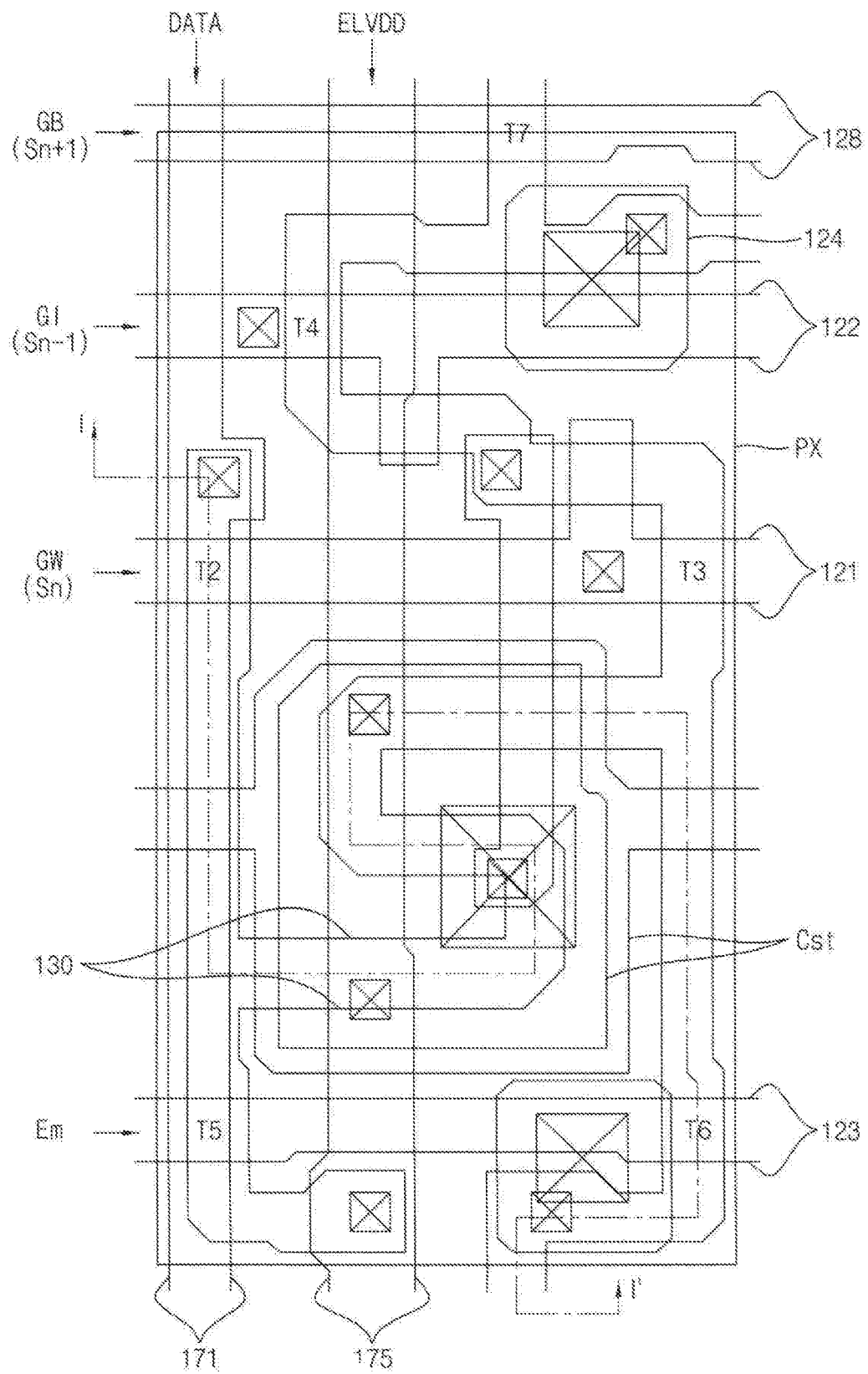
FIG. 3 is a layout diagram illustrating an example of a plurality of transistors and a capacitor included in the sub-pixel of FIG. 2.
Figure 4:
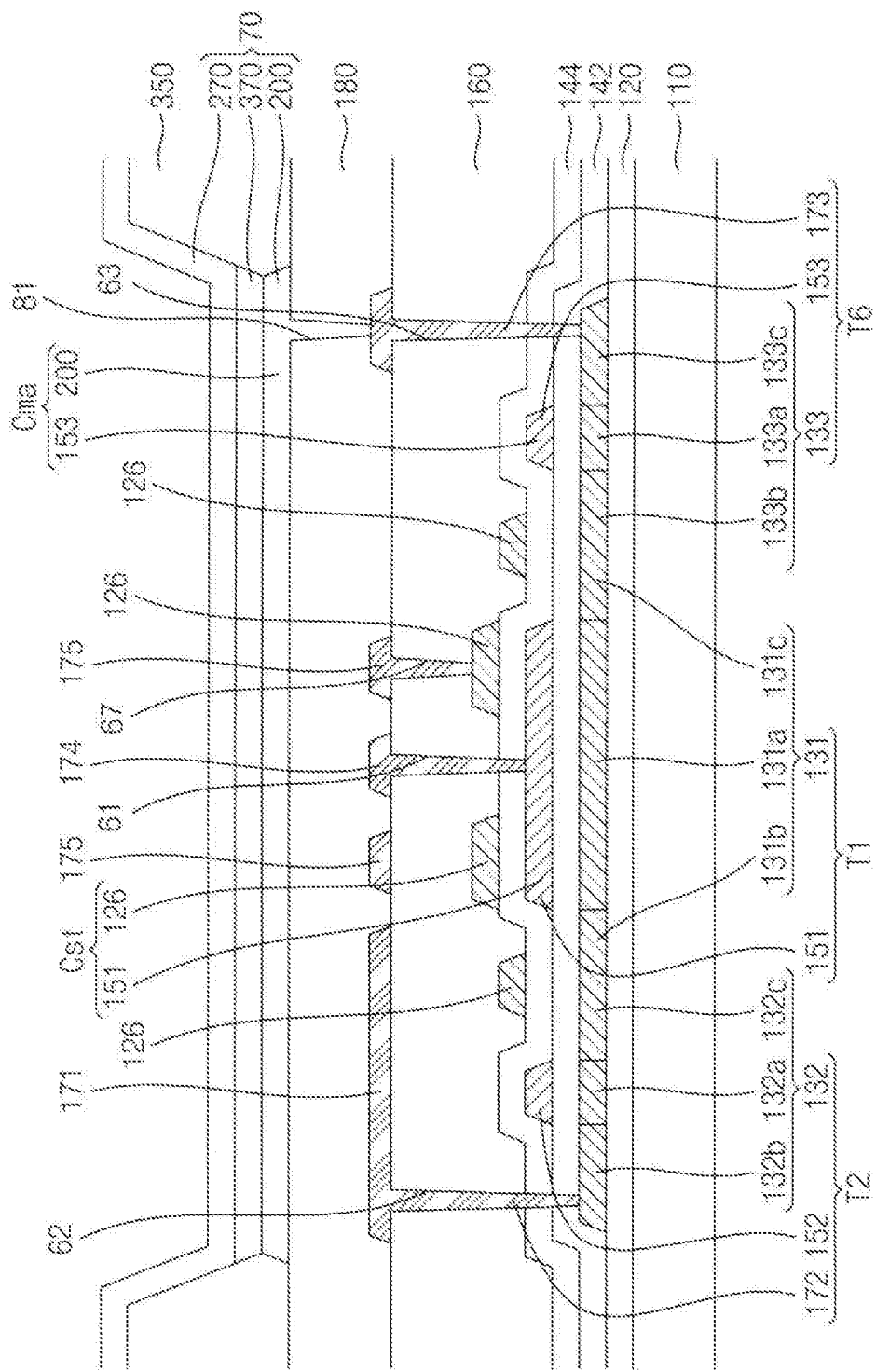
FIG. 4 is a view taken along the line I-I' of FIG. 3.

FIG. 2 is a circuit diagram illustrating an example of a sub-pixel included in the organic light emitting display panel of FIG. 1, FIG. 3 is a layout diagram illustrating an example of a plurality of transistors and a capacitor included in the sub-pixel of FIG. 2, and FIG. 4 is a view taken along the line I-I' of FIG. 3.

Referring to FIGS. 2, 3, and 4, a sub-pixel in the organic light emitting display panel 1000 may include a switching transistor T2 connected to a data line 171 and having a gate electrode configured to receive a scan signal GW (or Sn), and may also include a driving transistor T1 connected to the switching transistor T2, an emission control transistor(s) T5 and T6 connected to the driving transistor T1 and having a gate electrode(s) configured to receive an emission control signal Em, an emission control line 123 connected to the gate electrode of the emission control transistor(s) T5 and T6, an organic light emitting diode EL connected the emission control transistor(s) T5 and T6, and a coupling capacitor/coupling capacitance Cma having a first electrode, which includes a portion of the emission control line 123, and having a second electrode, which includes an anode of the organic light emitting diode EL overlapping with the first electrode (i.e., overlapping with the emission control line 123). Here, the transistor T5 may be referred to as an operation control transistor.

In one embodiment, the sub-pixel may further include a storage capacitor Cst, a compensation transistor T3, an initialization transistor T4, and a bypass transistor T7.

The sub-pixel may also include a scan line 121, an initialization line 122, the emission control line 123, and a bypass control line 128, which respectively apply a scan signal GW (e.g., Sn), an initialization signal GI (e.g., Sn−1), the emission control signal Em, and a bypass control signal GB (e.g., Sn+1). These lines 121, 122, 123, and 128 may extend in a row direction. The sub-pixel may also include the data line 171 and a driving voltage line 175, which cross the scan line 121, the initialization line 122, the emission control line 123, and the bypass control line 128. The data line 171 and the driving voltage line 175 may apply a data signal DATA and a driving voltage ELVDD, respectively. An initialization voltage VINT may be transferred to the driving transistor T1, via initialization transistor T4, through an initialization voltage line 124.

The driving transistor T1 may include a gate electrode connected to a first electrode of the storage capacitor Cst, a source electrode connected to the driving voltage line 175 via the operation control transistor T5, and a drain electrode electrically connected to the anode of the organic light emitting diode EL via the emission control transistor T6. The driving transistor T1 may receive the data signal DATA according to a switching operation of the switching transistor T2, and may supply a driving current to the organic light emitting diode EL.

The switching transistor T2 may include a gate electrode connected to the scan line 121, a source electrode connected to the data line 171, and a drain electrode connected to the source electrode of the driving transistor T1. The switching transistor T2 may be turned on according to the scan signal GW received through the scan line 121, and may transmit the data signal DATA from the data line 171 to the source electrode of the driving transistor T1.

The compensation transistor T3 may include a gate electrode connected to the scan line 121, a source electrode connected to the drain electrode of the driving transistor T1, and a drain electrode connected to the first electrode of the storage capacitor Cst, which is also connected to a drain electrode of the initialization transistor T4 and the gate electrode of the driving transistor T1. The compensation transistor T3 may be turned on according to the scan signal GW to diode-connect the driving transistor T1, such that a threshold voltage of the driving transistor T1 may be compensated.

The initialization transistor T4 may include a gate electrode connected to the initialization line 122, a source electrode connected to the initialization voltage line 124, and a drain electrode connected to the drain electrode of the compensation transistor T3 and connected to the gate electrode of the driving transistor T1. The initialization transistor T4 may be turned on according to the initialization signal GI to transmit the initialization voltage VINT to the gate electrode of the driving transistor T1, such that the gate voltage of the driving transistor T1 may be initialized.

The operation control transistor T5 may include a gate electrode connected to the emission control line 123, a source electrode connected to the driving voltage line 175, and a drain electrode connected to the source electrode of the driving transistor T1.

The emission control transistor T6 may include a gate electrode connected to the emission control line 175, a source electrode connected to the drain electrode of the driving transistor T1 and connected to the source electrode of the compensation transistor T3, and a drain electrode connected to the anode of the organic light emitting diode EL. The operation control transistor T5 and the emission control transistor T6 may be concurrently turned on according to the emission control signal Em, such that the driving current may flow into the organic light emitting diode EL.

The bypass transistor T7 may include a gate electrode connected the bypass control line 128, a source electrode connected to the drain electrode of the emission control transistor T6 and connected to the anode of the organic light emitting diode EL, and a drain electrode connected to the initialization voltage line 124.

The first electrode of the coupling capacitor Cma may include the gate electrode of the emission control transistor T6, the gate electrode of the operation control transistor T5, and a portion of the emission control line 123. The second electrode of the coupling capacitor Cma may include the anode 200 of the organic light emitting diode EL overlapping with the first electrode of the coupling capacitor Cma (i.e., overlapping with the emission control line 123). When AID dimming is performed, a voltage of the anode 200 of the organic light emitting diode EL (i.e., an anode voltage) may be changed/raised by the coupling, or by extracting the partial voltage of the emission control signal Em of the coupling capacitor Cma.

The coupling capacitor Cma may be formed according to the color of light emitted from the respective sub-pixel. In one embodiment, the capacitances of the first and second capacitors Cma1 and Cma2 may be greater than the capacitance of the third capacitor Cma3 when the emission efficiency of the third sub-pixel PX3 is higher than the emission efficiencies of the first and second sub-pixels PX1 and PX2. For example, the areas of the first and second electrodes of the first capacitor Cma1, and the areas of the first and second electrodes of the second capacitor Cma2, may be greater than the areas of the first and second electrodes of the third capacitor Cma3. Thus, amounts of raised anode voltages of the first and second sub-pixels PX1 and PX2 may be greater than amount of raised anode voltage of the third sub-pixel PX3 when the AID dimming is performed. Thus, the color difference of the sub-pixels caused by the difference of the emission efficiency may be prevented or reduced.

A first electrode of the storage capacitor Cst may include the gate electrode of the driving transistor T1, and a second electrode of the storage capacitor Cst may include a conductive pattern overlapping the first electrode of the storage capacitor Cst (i.e., overlapping with the gate electrode of the driving transistor T1). The conductive pattern may be a portion of the driving voltage line 175 that overlaps the gate electrode of the driving transistor T1. A cathode of the organic light emitting diode EL may be connected to a common voltage ELVSS. Accordingly, the organic light emitting diode EL may receive the driving current from the driving transistor T1 to emit light of a certain color.

The driving transistor T1, the switching transistor T2, the compensation transistor T3, the initialization transistor T4, the operation control transistor T5, the emission control transistor T6, and the bypass transistor T7 may be formed along a semiconductor layer 131. The semiconductor layer 131 may be curved in various shapes.

The semiconductor layer 131 may be made of, for example, polysilicon or oxide semiconductor. The oxide semiconductor may include one of an oxide based on titanium (Ti), hafnium (Hf), zirconium (Zr), aluminum (Al), tantalum (Ta), germanium (Ge), zinc (Zn), gallium (Ga), tin (Sn), indium (In), zinc oxide (ZnO), indium-gallium-zinc oxide (InGaZnO4), indium zinc oxide (Zn—In—O), zinc-tin oxide (Zn—Sn—O), indium gallium oxide (In—Ga—O), indium-tin oxide (In—Sn—O), indium-zirconium oxide (In—Zr—O), indium-zirconium-zinc oxide (In—Zr—Zn—O), indium-zirconium-tin oxide (In—Zr—Sn—O), indium-zirconium-gallium oxide (In—Zr—Ga—O), indium-aluminum oxide (In—Al—O), indium-zinc-aluminum oxide (In—Zn—Al—O), indium-tin-aluminum oxide (In—Sn—Al—O), indium-aluminum-gallium oxide (In—Al—Ga—O), indium-tantalum oxide (In—Ta—O), indium-tantalum-zinc oxide (In—Ta—Zn—O), indium-tantalum-tin oxide (In—Ta—Sn—O), indium-tantalum-gallium oxide (In—Ta—Ga—O), indium-germanium oxide (In—Ge—O), indium-germanium-zinc oxide (In—Ge—Zn—O), indium-germanium-tin oxide (In—Ge—Sn—O), indium-germanium gallium oxide (In—Ge—Ga—O), titanium-indium-zinc oxide (Ti—In—Zn—O), and/or hafnium-indium-zinc oxide (Hf—In—Zn—O), which are complex oxides. When the semiconductor layer 131 is made of an oxide semiconductor, a separate passivation layer may be added to protect the oxide semiconductor from damage resulting from high temperatures and/or other external influences.

The semiconductor layer 131 may include a channel region, a source region, and a drain region. The channel region may allow for formation of a channel, and may be doped with N-type impurity or P-type impurity. The source and drain regions may be formed at respective sides of the channel region, and may be formed by doping a doped impurity having a conductivity type opposite to the conductivity type of the channel region.

Hereinafter, an example of a construction of the sub-pixel including the driving transistor T1, the switching transistor T2, and the emission control transistor T6 will be described referred to FIG. 4.

A buffer layer 120 may be disposed on a substrate 110. The substrate may include insulation materials, such as a glass, quartz, ceramic, plastic, or etc.

A driving semiconductor layer 131, a switching semiconductor layer 132, and an emission control semiconductor layer 133 may be disposed on the buffer layer 120. The driving semiconductor layer 131 may include a driving source region 131b and a driving drain region 131c, which face each other with a driving channel region 131a therebetween. The switching semiconductor layer 132 may include a switching source region 132b and a switching drain region 132c, which face each other with a switching channel region 132a therebetween. The emission control semiconductor layer 133 may include a emission control source region 133b and a emission control drain region 133c, which face each other with a emission control channel region 133a therebetween.

A first gate insulation layer 142 may be on the driving semiconductor layer 131, on the switching semiconductor layer 132, and on the emission control semiconductor layer 133.

A driving gate electrode 151 may be on the first gate insulation layer 142 overlapping the driving channel region 131a. A switching gate electrode 152 may be disposed on the first gate insulation layer 142 overlapping the switching channel region 132a. An emission control gate electrode 153 may be on the first gate insulation layer 142 overlapping the emission control channel region 133a. The scan line 121 may be connected to the switching gate electrode 152, and may be located on the same layer as the switching gate electrode 152. The emission control line 123 may be connected to the emission control gate electrode 153, and may be located on the same layer as the emission control gate electrode 153. The driving gate electrode 151 may include the first electrode of the storage capacitor Cst.

A second gate insulation layer 144 may be disposed on the driving gate electrode 152, the switching gate electrode 151, the emission control gate electrode 153, the scan line 121, and the emission control line 123. The first and second gate insulation layers 142 and 144 may be formed of silicon nitride (SiNx) or silicon oxide (SiO2).

The conductive pattern 126, at least a portion of which acting as the second electrode of the storage capacitor Cst, may be on the second gate insulation layer 144.

An insulation interlayer 160 may be located on the second gate insulation layer 144 and the conductive pattern 126. The insulation interlayer 160 may include ceramic-based materials, such as silicon nitride (SiNx), silicon oxide (SiO2), etc.

The data line 171 including a switching source electrode 172 (i.e., the source electrode of the switching transistor T2), the driving voltage line 175 for transmitting the driving voltage ELVDD, a connecting member 174 to connect the driving gate electrode 151 and the drain electrode of the compensation transistor T3, and an emission control drain electrode 173 (i.e., the drain electrode of the emission control transistor T6) may all be located on the insulation interlayer 160.

The switching source electrode 172 may be connected to the switching semiconductor layer 132 via a contact hole 62. The emission control drain electrode 173 may be connected to the emission control semiconductor layer 133 via a contact hole 63. The driving voltage line 175 may be connected to the second electrode 126 of the storage capacitor Cst via a contact hole 67. An end of the connecting member 174 may be connected to the driving gate electrode 151 via the contact hole 61.

A passivation layer 180 may be on the insulation interlayer 160 to cover the data line 171, the driving voltage line 175, etc.

A pixel electrode (i.e., the anode) 200 may be on the passivation layer 180. The pixel electrode 200 may be connected to the emission control gate electrode 173 via a contact hole 81.

A partition wall 350 may be on the passivation layer 180 and on an edge of the pixel electrode 200. The partition wall 350 may have an opening exposing the pixel electrode 200. The partition wall 350 may be made of, for example, a resin, such as polyacrylates resin, polyimides, and/or a silica-based inorganic material.

An organic light emission layer 370 may be disposed on the exposed pixel electrode 200. A common electrode (i.e., the cathode) 270 may be on the organic light emission layer 370. As such, the organic light emitting diode 70, which includes the pixel electrode 200, the organic emission layer 370, and the common electrode 270, may be formed.

Here, the portion of the pixel electrode/anode 200 may overlap the emission control gate electrode 153 (i.e., the gate electrode of the emission control transistor T6) and may overlap a portion of the emission control line 123. Thus, the overlapped portions may cause coupling capacitance, and may be referred to as, or may act as, the coupling capacitor Cma.

The sub-pixel may include the first sub-pixel PX1 for emitting the red color light, the second sub-pixel PX2 for emitting the blue color light, and the third sub-pixel PX3 for emitting the green color light. Here, the capacitance of the coupling capacitor Cma of the sub-pixel having relatively high emission efficiency may be set lower than the coupling capacitor Cma of the sub-pixel having relatively low emission efficiency. Thus, the color difference of the sub-pixels caused by difference in emission efficiency may be prevented or reduced when the AID dimming is performed.

Figure 5:
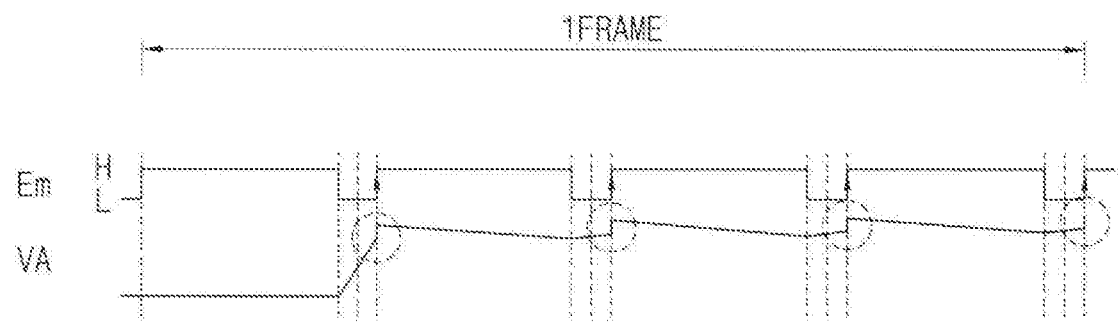
FIG. 5 is a timing diagram illustrating an example of a voltage change of an anode of an organic light emitting diode included in the sub-pixel of FIG. 2.
Figure 6:
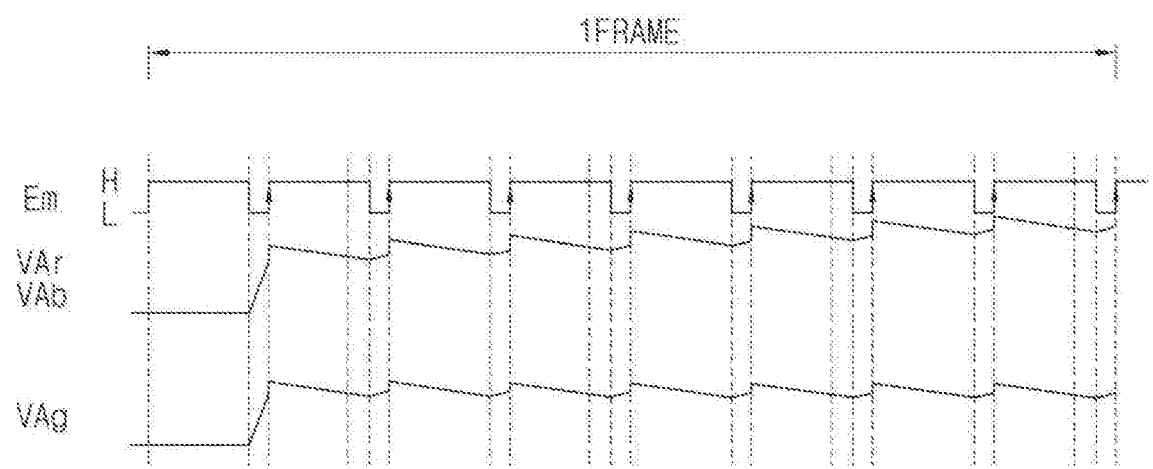
FIG. 6 is a timing diagram illustrating another example of a voltage change of an anode of an organic light emitting diode included in the sub-pixel of FIG. 2.

FIG. 5 is a timing diagram illustrating an example of a voltage change of an anode of an organic light emitting diode included in the sub-pixel of FIG. 2, and FIG. 6 is a timing diagram illustrating another example of a voltage change of an anode of an organic light emitting diode included in the sub-pixel of FIG. 2.

Referring to FIGS. 5 and 6, the anode voltage VA of the organic light emitting diode EL may be raised/increased by the coupling capacitor Cma.

As illustrated in FIGS. 5 and 6, when the AID dimming is performed, an emission control signal Em may swing a plurality of times between an inactive level H and an active level L during an emission period within a frame period. The emission period may be a period in which the organic light emitting diode EL emits light. For example, the emission control signal Em may periodically swing 4 times or 8 times. As a dimming level increases, a length of a period that the emission control signal Em has the inactive level H may increase, such that the luminance may thereby decrease. In contrast, as the dimming level decreases, a length of a period that the emission control signal Em has the active level L may increase, such that the luminance may thereby increase.

FIGS. 5 and 6 illustrate an embodiment of using p-channel metal-oxide semiconductor (PMOS) transistor. For example, the emission control signal Em applied to the gate electrodes of the PMOS transistor may be activated with a logical low level L. However, this is an example, and the emission transistor can be replaced with n-channel metal-oxide semiconductor (NMOS) transistors, and, in such an embodiment, the signals applied to the gate electrodes of the NMOS transistor can be activated with a logic high level.

When the emission control signal Em has the active level L, the emission control transistor T6 may be turned on, and a driving current/emission current may flow into the organic light emitting diode EL. Here, the driving current and corresponding luminance may be changed according to the anode voltage VA. When the emission control signal Em has the active level L, the emission control transistor T6 may be turned on, and the anode voltage VA may increase.

When the emission control signal Em changes to the inactive level H (i.e., a rising edge of the emission control signal Em), the emission control transistor T6 may be turned off. At the same time, the anode voltage VA may be raised by the coupling capacitor Cma. For example, the coupling capacitor Cma may extract partial voltage of the emission control signal Em to the anode. The increment of anode voltage VA may be determined by the capacitance of the coupling capacitor Cma. For example, as the capacitance of the coupling capacitor increases, the increment of the anode voltage VA may increase.

Because the emission efficiency of the green sub-pixel is relatively higher than the emission efficiencies of the red and blue sub-pixels, a screen (e.g., the organic light emitting display panel) has a defect of an unwanted greenish hue when the panel displays a low-luminance/low-grayscale image having a low driving current. Accordingly, as illustrated in FIG. 6, the organic light emitting display panel may raise a red anode voltage VAr (i.e., the anode voltage of the red sub-pixel), and may raise a blue anode voltage VAb (the anode voltage of the blue sub-pixel), to thereby increase the luminance of the red and blue sub-pixels. In addition, the green anode voltage VAg (i.e., the anode voltage of the green sub-pixel), may maintain the voltage level, or may decrease. Thus, the capacitances of the coupling capacitors in the red and blue sub-pixels may be greater than the capacitance of the coupling capacitor in the green sub-pixel. For example, the overlapping areas between the anodes of the red and blue sub-pixels and the emission control line may be greater than the overlapping area between the anode of the green sub-pixel and the emission control line.

Thus, the color difference of the sub-pixels caused by different emission efficiencies may be prevented or reduced.

Figure 7:
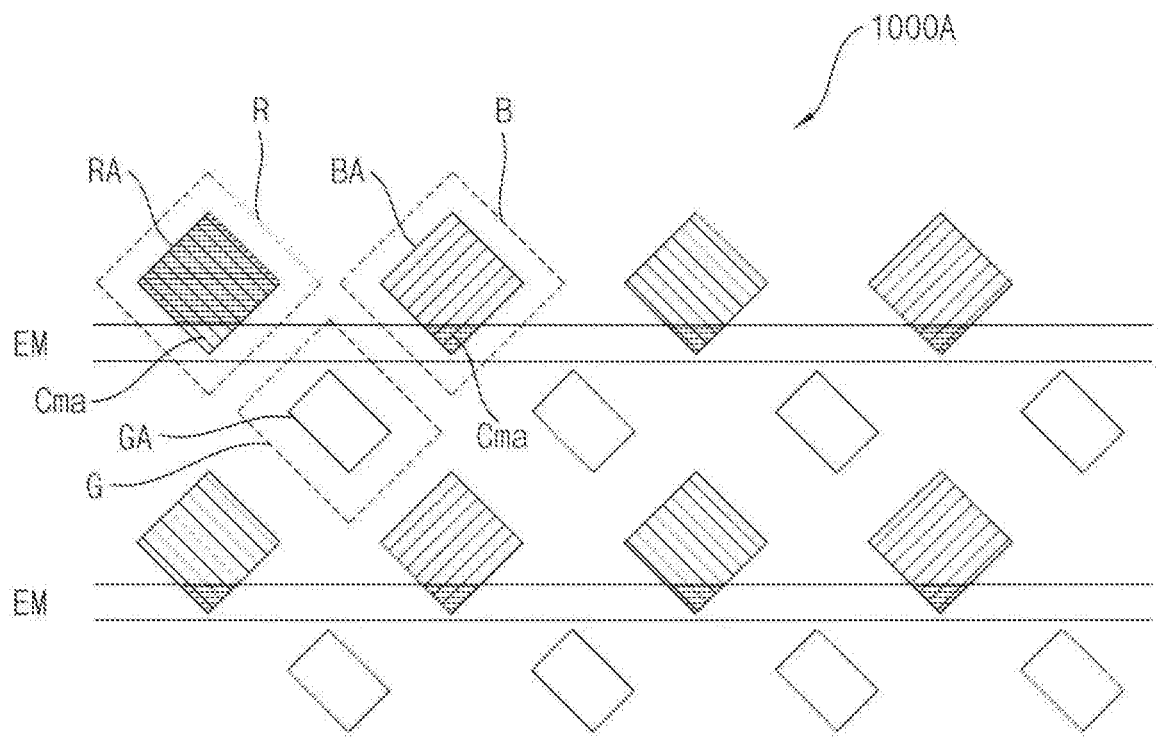
FIG. 7 is a diagram of a portion of an organic light emitting display panel according to example embodiments.
Figure 8:
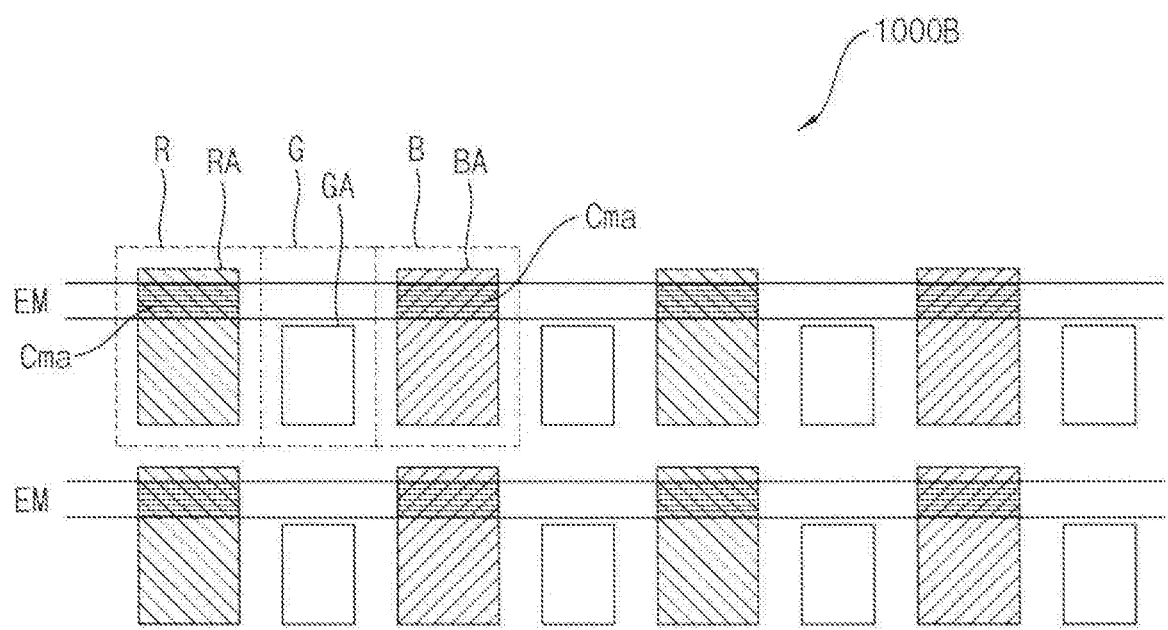
FIG. 8 is a diagram illustrating an example of the organic light emitting display panel of FIG. 7.

FIG. 7 is a diagram of an organic light emitting display panel according to example embodiments, and FIG. 8 is a diagram illustrating an example of the organic light emitting display panel of FIG. 7.

The organic light emitting display panel of the present example embodiments is substantially the same as the organic light emitting display panel explained with reference to FIGS. 1, 2, 3, and 4, with the exception of a construction of the third sub-pixel not including the coupling capacitor. Thus, the same reference numerals will be used to refer to the same or like parts as those described in the example embodiments of FIG. 1, and any repetitive explanation concerning the above elements will be omitted.

Referring to FIGS. 7 and 8, the organic light emitting display panel 1000A and 1000B may include a plurality of pixels. Each of the pixels may include a first sub-pixel R, a second sub-pixel B, and a third sub-pixel G for respectively outputting different color lights. In one embodiment, the first through third sub-pixels R, B, and G may be arranged in a pentile structure.

In one embodiment, the first sub-pixel R may emit red color light, the second sub-pixel B may emit blue color light, and the third sub-pixel G may emit green color light. Each of the first through third sub-pixels R, B, and G may include a driving transistor, a switching transistor, an emission control transistor connected to the driving transistor and having a gate electrode configured to receive an emission control signal, an emission control line EM connected to the gate electrode of the emission control transistor, and an organic light emitting diode connected the emission control transistor. Here, some portions of the emission control line EM may overlap an anode RA of the organic light emitting diode of the first sub-pixel R and an anode BA of the organic light emitting diode of the second sub-pixel B. In other words, each of the first and second sub-pixels R and B may further include a coupling capacitor Cma having a first electrode, which includes a portion of the emission control line EM, and a second electrode, which includes the anode RA and BA of the organic light emitting diode overlapping with the portion of the emission control line EM. For example, the first and second sub-pixels R and B may be substantially the same as the first and second sub-pixels of FIGS. 1, 2, 3, and 4.

In one embodiment, a gate electrode of the emission control transistor of the third sub-pixel G and the emission control line EM might not overlap the anode GA of the organic light emitting diode of the third sub-pixel G. Thus, the third sub-pixel G might not include a coupling capacitance or the coupling capacitor Cma. The third sub-pixel G may have substantially the same constructions as the first and second sub-pixels R and B, except for the coupling capacitor Cma.

Accordingly, the luminance of the first and second sub-pixels R and B having relatively low emission efficiency may be increased by the operation of the coupling capacitor Cma when the AID dimming is performed. Thus, the color difference of the sub-pixels R, G, and B in a low-luminance/low-grayscale image may be prevented or reduced.

As illustrated in FIG. 8, the first through third sub-pixels R, B, and G may be arranged in a stripe structure in the organic light emitting display panel 1000B.

In one embodiment, as illustrated in FIG. 1, a portion of the emission control line EM may overlap the anode GA of the organic light emitting diode in the third sub-pixel G. Accordingly, the third sub-pixel G may include the coupling capacitor Cma. Here, the areas of the first and second electrodes of the coupling capacitor Cma in the first sub-pixel R, and the areas of the first and second electrodes of the coupling capacitor Cma in the second sub-pixel B, may be greater than areas of the first and second electrodes of the coupling capacitor in the third sub-pixel G.

Figure 9:
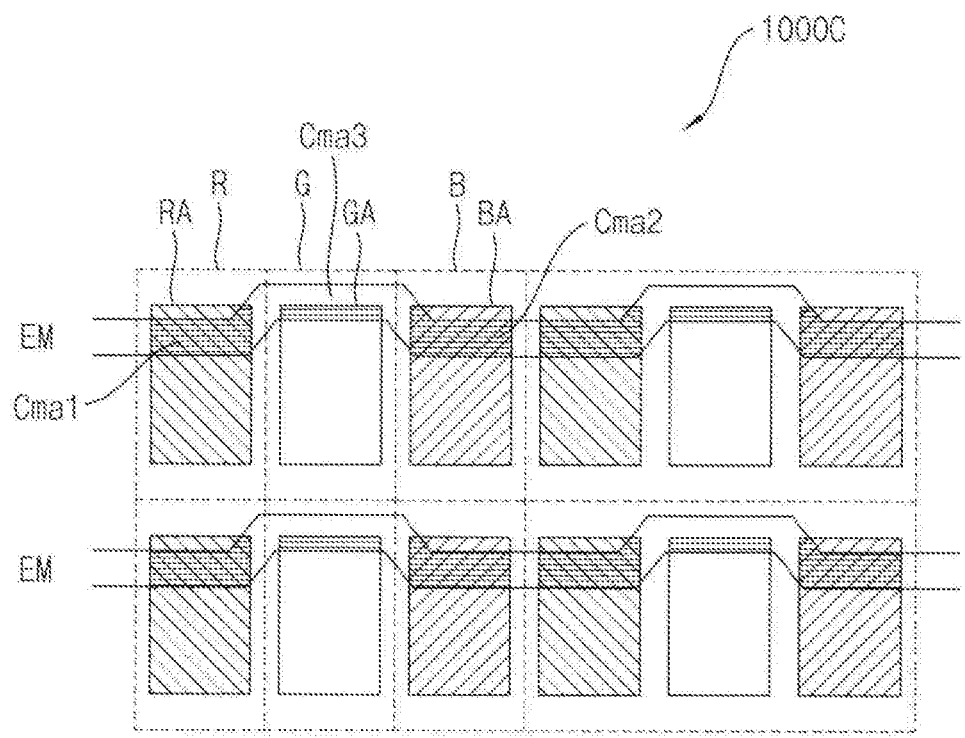
FIG. 9 is a diagram of an organic light emitting display panel according to example embodiments.

FIG. 9 is a diagram of an organic light emitting display panel according to example embodiments.

The organic light emitting display panel of the present embodiment is substantially the same as the organic light emitting display panel explained with reference to FIGS. 1, 2, 3, and 4, except for arrangements of the emission control line EM and the sub-pixels. Thus, the same reference numerals will be used to refer to the same or like parts as those described in the example embodiments of FIG. 1, and any repetitive explanation concerning the above elements will be omitted.

Referring to FIG. 9, the organic light emitting display panel 1000C may include a plurality of pixels. Each of the pixels may include a first sub-pixel R, a second sub-pixel B, and a third sub-pixel G for respectively outputting lights of different colors. In one embodiment, the first through third sub-pixels R, B, and G may be arranged in a stripe structure.

In one embodiment, the first sub-pixel R may emit red color light, the second sub-pixel B may emit blue color light, and the third sub-pixel G may emit green color light.

Some portions of the emission control line EM may overlap an anode RA of the organic light emitting diode of the first sub-pixel R, and may overlap an anode BA of the organic light emitting diode of the second sub-pixel B. Each of the first and second sub-pixels R and B may further include a coupling capacitor Cma due to the overlap between the anodes RA and BA and the emission control line EM.

The emission control line EM may be formed to reduce or minimize an overlapped area with the anode GA of the organic light emitting diode of the third sub-pixel G. For example, as illustrated in FIG. 9, the emission control line EM may have a curved shape at both ends of the anode GA of the third sub-pixel G, such that the overlapped area between the emission control line EM and the anode GA of the third sub-pixel G may be relatively reduced. Thus, the third sub-pixel G may include a third capacitor Cma3 that is smaller than, or has a smaller capacitance than, first and second capacitors Cma1 and Cma2. In other words, the capacitance of the third capacitor Cma3 may be less than the first and second capacitors Cma1 and Cma2.

In one embodiment, the emission control line EM may have curved shape at both ends of the anode GA of the third sub-pixel G such that the emission control line EM does not overlap the anode GA of the third sub-pixel G. In this case, the third sub-pixel G might not include the third coupling capacitor Cma3.

As described above, the luminance of the first and second sub-pixels R and B having relatively low emission efficiency may be increased by the operation of the coupling capacitor Cma1 and Cma2 when the AID dimming is performed. Thus, the color difference of the sub-pixels R, G, and B in a low-luminance/low-grayscale image may be prevented or reduced.

The present embodiments may be applied to any organic light emitting display device and any system including the organic light emitting display device. For example, the present embodiments may be applied to a television, a computer monitor, a laptop, a digital camera, a TV, a digital TV, a 3D TV, a cellular phone, a smart phone, a smart pad, a personal digital assistant (PDA), a portable multimedia player (PMP), a MP3 player, a navigation system, a game console, a video phone, etc.

The foregoing is illustrative of example embodiments, and is not to be construed as limiting thereof. Although a few example embodiments have been described, those skilled in the art will readily appreciate that many modifications are possible in the example embodiments without materially departing from the novel teachings and advantages of example embodiments. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of example embodiments and is not to be construed as limited to the specific embodiments disclosed, and that modifications to the disclosed example embodiments, as well as other example embodiments, are intended to be included within the scope of the appended claims. The inventive concept is defined by the following claims, with equivalents of the claims to be included therein.

What is claimed is:

1. An organic light emitting display panel comprising a first sub-pixel, a second sub-pixel, and a third sub-pixel, each of the first and second sub-pixels comprising:
   a switching transistor connected to a data line, and having a gate electrode configured to receive a scan signal;
   a driving transistor connected to the switching transistor;
   an emission control transistor connected to the driving transistor, and having a gate electrode configured to receive an emission control signal;
   an emission control line of which a part is the gate electrode of the emission control transistor;
   an organic light emitting diode electrically connected to the driving transistor through a via hole; and
   a coupling capacitor comprising:
   a first electrode comprising a portion of the emission control line; and
   a second electrode comprising a first electrode layer of the organic light emitting diode overlapping the portion of the emission control line,
   wherein capacitances of the coupling capacitors of the first and second sub-pixels are different.

2. The panel of claim 1, wherein an entire width of the emission control line overlaps the second electrode of a first capacitor comprising the coupling capacitor of the first sub-pixel and the second electrode of a second capacitor comprising the coupling capacitor of the second sub-pixel.

3. The panel of claim 1, wherein the first electrode further comprises at least a portion of the gate electrode of the emission control transistor.

4. The panel of claim 1, wherein the first sub-pixel is configured to emit red color light,
   wherein the second sub-pixel is configured to emit blue color light,
   wherein the third sub-pixel is configured to emit green color light, and
   wherein an emission efficiency of the third sub-pixel is higher than an emission efficiency of each of the first and second sub-pixels.

5. The panel of claim 1, wherein the emission control transistor is configured to receive the emission control signal that swings between an inactive level and an active level during an emission period within a frame period, the emission period comprising a period in which the organic light emitting diode is configured to emit light.

6. The panel of claim 5, wherein the coupling capacitor is configured to raise a voltage of an anode of the organic light emitting diode by coupling based on the emission control signal swing.

7. The panel of claim 1, wherein each of the first and second sub-pixels further comprises a storage capacitor, the storage capacitor comprising:
   a first electrode comprising a gate electrode of the driving transistor; and
   a second electrode comprising a conductive pattern overlapping the first electrode of the storage capacitor.

8. The panel of claim 7, wherein each of the first and second sub-pixels further comprises:
   a compensation transistor connected to the driving transistor for compensating a threshold voltage of the driving transistor, and comprising a gate electrode configured to receive the scan signal.

9. The panel of claim 8, wherein each of the first and second sub-pixels further comprises:
   an initialization transistor connected to the gate electrode of the driving transistor, and comprising a gate electrode configured to receive an initialization signal to transmit an initialization voltage to the gate electrode of the driving transistor; and
   a bypass transistor connected to an anode of the organic light emitting diode, and comprising a gate electrode configured to receive a bypass control signal to transmit the initialization voltage to the anode.

10. The panel of claim 1, wherein the first through third sub-pixels are arranged in a pentile structure.

11. The panel of claim 1, wherein the first through third sub-pixels are arranged in a stripe structure.

* * * * *